Figure 1:
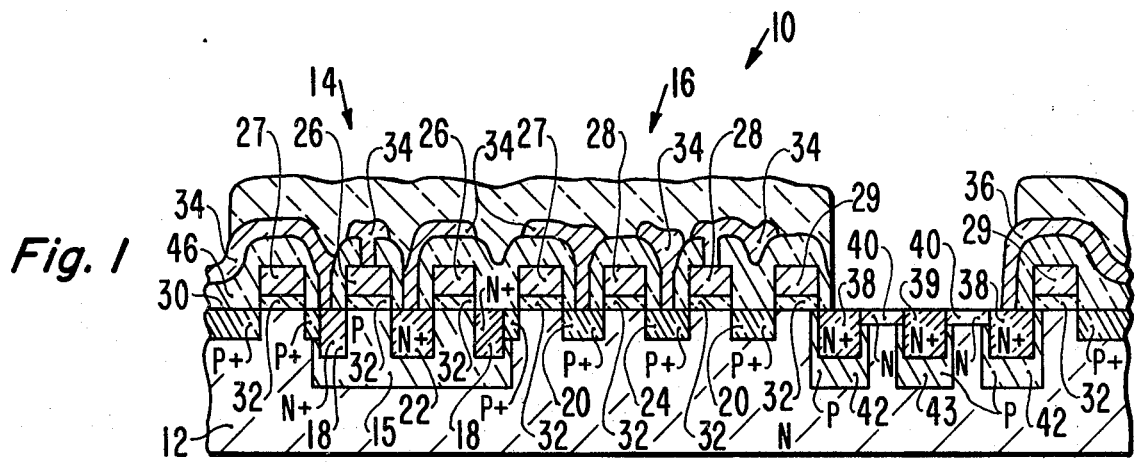

United States Patent [19]

Dingwall

[11] 4,159,561
[45] Jul. 3, 1979

[54] METHOD OF MAKING A SUBSTRATE CONTACT FOR AN INTEGRATED CIRCUIT

[75] Inventor: Andrew G. F. Dingwall, Bridgewater, N.J.

[73] Assignee: RCA Corp., New York, N.Y.

[21] Appl. No.: 862,530

[22] Filed: Dec. 19, 1977

Related U.S. Application Data

[62] Division of Ser. No. 786,246, Apr. 11, 1977, Pat. No. 4,081,896.

[51] Int. Cl.² .............................................. B01J 17/00
[52] U.S. Cl. ...................................... 29/571; 29/578; 29/590; 357/59; 357/91
[58] Field of Search .......................... 29/571, 578, 590; 357/59, 91

[56] References Cited

U.S. PATENT DOCUMENTS 4,050,965 9/1977 Ipri ........................................ 29/578

Primary Examiner—W. Tupman
Attorney, Agent, or Firm—H. Christoffersen; Sanford J. Asman

[57] ABSTRACT

Electrical contact to the substrate of a COS/MOS integrated circuit made with a four photomask process and having a well region of conductivity type opposite to that of the substrate is made by ion implanting through the bond pad openings to reconvert portions of the well to the opposite conductivity type thereby allowing contact to be made to the underlying substrate from the top surface.

2 Claims, 7 Drawing Figures

U.S. Patent Jul. 3, 1979 Sheet 1 of 2 4,159,561

METHOD OF MAKING A SUBSTRATE CONTACT FOR AN INTEGRATED CIRCUIT

This is a division, of application Ser. No. 786,246, filed Apr. 11, 1977, now U.S. Pat. No. 4,081,896.

The present invention relates to integrated circuit devices. In particular, the present invention relates to a method for contacting the substrate of an integrated circuit structure from the top of the substrate which utilizes complementary symmetry metal oxide semiconductor (COS/MOS) logic and which may employ a closed silicon gate structure surrounding the drains of the insulated gate field effect transistors (IGFETs). Such a device has been described in U.S. patent application Ser. No. 585,874 filed June 11, 1975 by the present inventor, now continuation-in-part application Ser. No. 749,410, filed Dec. 10, 1976, entitled INTEGRATED CIRCUIT DEVICE INCLUDING BOTH N-CHANNEL AND P-CHANNEL INSULATED GATE FIELD EFFECT TRANSISTORS (IGFETs). In that patent application, an integrated circuit which includes both N-channel and P-channel IGFETs is described in which the gate structure encloses the drain structure for each IGFET. The geometry described in that particular application has become known as Closed CMOS Logic, called "$C^2L$", in view of the closed gate structure and the utilization of complementary symmetry IGFETs. Advantages of $C^2L$ technology are described more fully in the patent application identified above. $C^2L$ integrated circuits may be manufactured by using a procedure involving four photomasks plus a fifth photomask used to define bond pad openings which is described herein. The invention may also be employed in CMOS structures having conventional silicon gates, and will also result in saving a photomask step.

The four photomask process utilizes semiconductor gate structures which overlie the surface of the substrate of the device and which are separated from the surface of the substrate by an insulating oxide layer in a manner known in the art to produce IGFETs. The four photomask process uses the gates as masks in the processing of the semiconductor devices. Following the formation of devices using the four photomask process, it is difficult to make contact to the top of the substrate because the upper surface of the substrate is either of a conductivity type opposite that of the bulk of the substrate, or it is of the same conductivity as the bulk of the substrate but isolated therefrom by a well of opposite conductivity type, or it is covered by an insulating oxide or a silicon gate. Since it is frequently desirable to provide an ohmic contact to the substrate from the top surface of the device, as when plastic packages are used, the present invention relates to a method for forming contacts to the upper surface of a substrate or for inserting special diffusions, such as resistor regions into devices manufactured either by the four photomask process referred to or by any other process which has a similar inherent problem without additional photomasking steps by utilizing the mask which is normally used only to open a protective coating to expose the bond pads.

In the drawings:

FIG. 1 is a cross-sectional view of the device made by the method of the present invention; and FIGS. 2, 3, 4, 5, 6, and 7 are cross-sectional views illustrating the method of manufacturing the devices shown in FIG. 1.

Referring generally to FIG. 1, a semiconductor device 10, in this case a portion of a $C^2L$ integrated circuit is shown. The device 10 comprises a semiconductor substrate 12, preferably of N type silicon, in which there is located at least one N-channel transistor 14 formed in a P well 15 and one P-channel transistor 16. The transistors 14 and 16 are IFGETs having a closed gate geometry, i.e. the sources 18, 20 of the transistors 14, 16 respectively, completely surround the drains 22, 24 of each transistor. The transistors 14, 16 each have polycrystalline silicon gates 26, 28, respectively, which are separated from the surface 30 of the substrate 12 by a gate oxide 32. The cross-section of FIG. 1 is taken through the center of the IGFETs. Therefore, the closed gates 26, 28, sources 18, 20, and other portions to be described are shown as split. Various conductors 34 are used to contact regions of the transistors 14, 16.

A conductor 36 contacts the substrate 12 through an N+ region 38 and an N type region 40. The N+ region 38 is formed in a P well 42.

Figure 2:
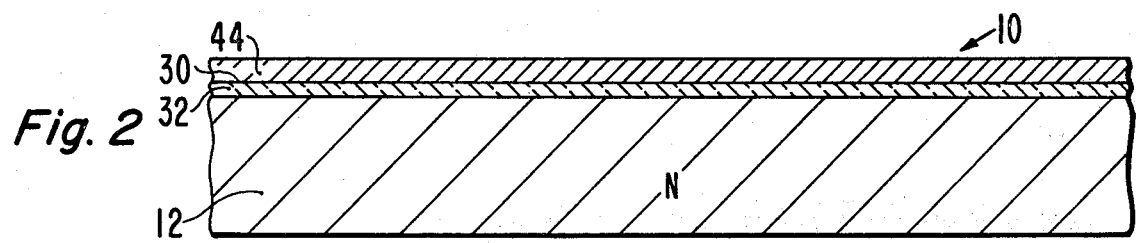

Referring generally to FIG. 2, in order to manufacture the device 10 one starts with a substrate 12, preferably N type silicon having a surface 30. An insulating layer 32, preferably comprising a layer of silicon dioxide, is formed by heating the substrate 12 to a temperature of about 875° C. in an atmosphere containing oxygen, steam, and a small quantity of HCl gas for a time sufficient to grow the layer 32 to a thickness of approximately 1000Å.

Figure 3:
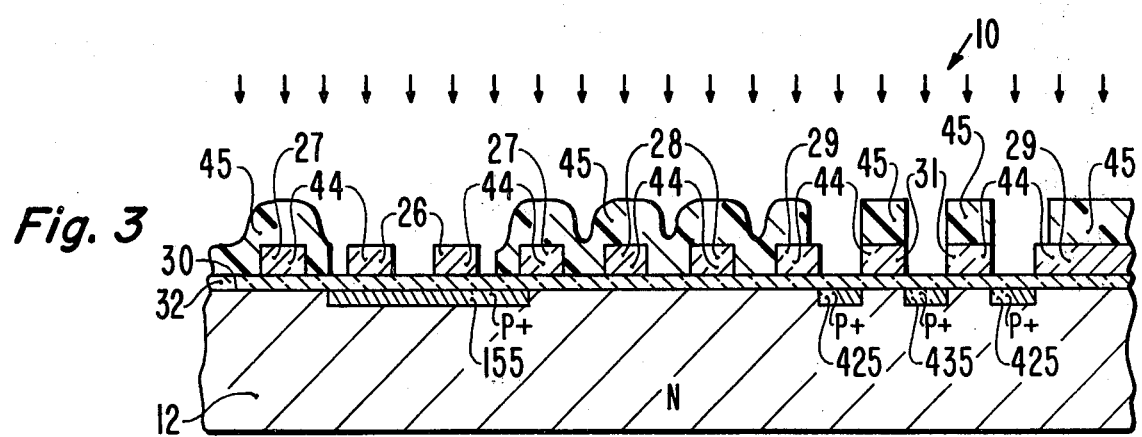

After completing the growth of the insulating layer 32, the substrate 12 is placed in a deposition reactor and a layer 44 of conductive material, preferably polycrystalline silicon is deposited thereon. Any known deposition reaction, such as the thermal decomposition of silane (SiH$_4$) may be employed. The process is carried out for a time sufficient to form the layer 44 to a thickness of about 3000Å. Using conventional photolithographic techniques a first layer of photoresist material (not shown) and a first photomask (not shown) are used to define on the layer 44 a pattern of gate structures 26, 27, 28 and 29 and gate-like structure 31 as shown in FIG. 3. The remaining portions of the layer 44 are then removed.

With continued reference to FIG. 3, a second layer of photoresist material 45 is deposited on the upper surface of the substrate 12 overlying the polycrystalline silicon gates. Using a second photomask (not shown) the layer of photoresist material 45 has defined thereon the boundaries of the P wells 15, 42, 43 which will be used in the integrated circuit 10. With the defined layer of photoresist 45 in place, the substrate 12 is placed in an ion implantation machine represented by the arrows in FIG. 3 and an acceptor impurity such as boron is implanted at sufficiently high energy to penetrate both the polycrystalline silicon gates and the underlying gate oxide layer 32. The result of the ion implantation is the formation of shallow P+ type regions 15S, 42S, and 43S in the substrate 12 beneath the gate 26 of the N-channel IGFET 14 and also under part of the surface 30 near the gate 29 and gate-like structure 31.

The photoresist coating 45 is left in place following the ion implantation step and the substrate 12 is next placed in an etchant for silicon dioxide, such as buffered HF, to remove parts of the layer 32 which were not covered by the photoresist layer 45 or by the polycrystalline silicon layer 44. Then, the remaining portions of the photoresist layer 45 are removed.

Figure 4:
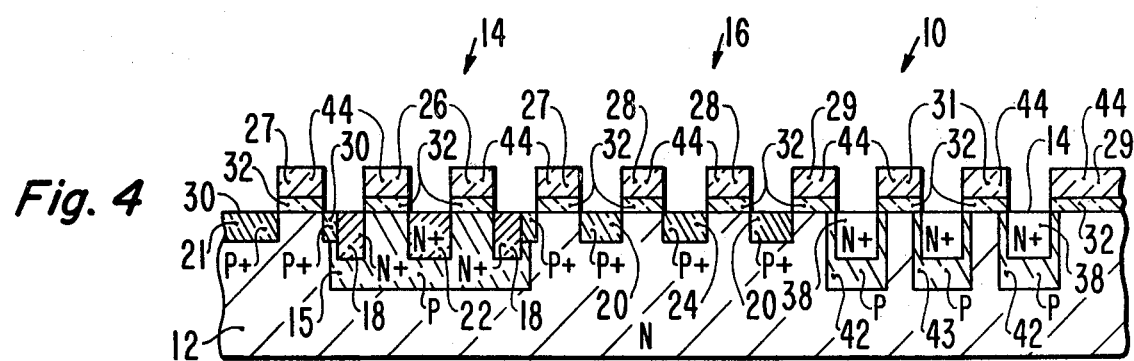

Referring now to FIG. 4, the next step is to drive the conductivity modifiers in the shallow P+ regions 15S, 42S, 43S into the substrate 12 in order to form the P wells 15, 42, 43. The distribution is accomplished by heating the substrate 12 to a temperature of about 1200° C. for about 20 hours. After completion of the drive-in diffusion of the P wells 15, 42, 43, a donor impurity, such as phosphorus, is diffused into the substrate 12 through the unmasked areas thereof to form the N+ type regions 18 and 22 comprising the source and drain respectively of the N-channel IGFET 14 as well as other N+ regions 38, 39 which will be explained hereinafter. This step is performed in a conventional manner and results also in the diffusion of the donor impurities into the polycrystalline silicon material 44 comprising the gates 26, 27, 28, and 29 and gate-like structure 31, making those regions conductive.

An etchant for silicon dioxide is then used to remove the remaining portions of the layer 32 which are not covered by the polycrystalline silicon gates 26, 27, 28, and 29 and gate-like structure 31. Next, acceptor impurities such as boron, are diffused into the uncovered parts of the surface 30. The result of the boron diffusion is to form P+ regions 20, 21, and 24 where the boron is diffused. However, P+ regions will not be formed where N+ regions have previously been formed, because the modifier concentration in the P+ regions is kept well below the concentration previously employed in forming the N+ regions.

Figure 5:
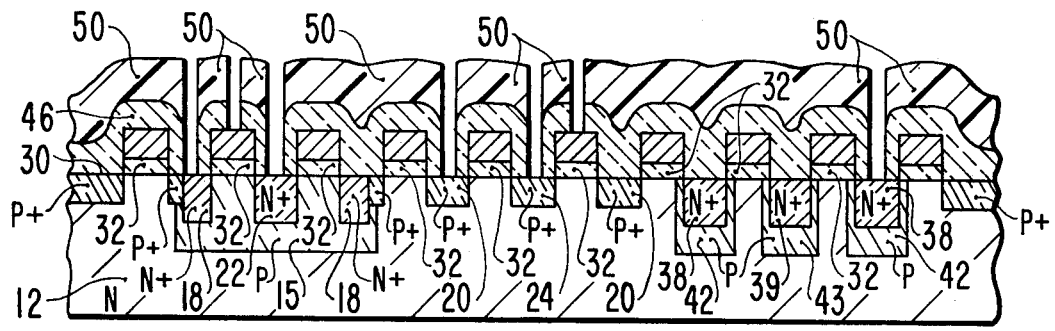
Figure 6:
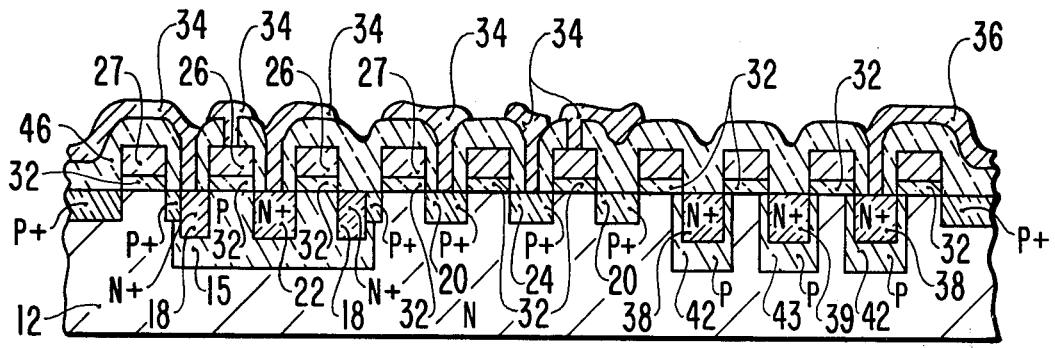

A relatively thick glass coating 46, as shown in FIG. 5 is then deposited on the surface of the substrate 12 and over the tops of the polycrystalline silicon portions 32, in any desired manner such as by a chemical vapor deposition process. Then, a third layer of photoresist 50 and a third photomask (not shown) are used to define the location of apertures in the glass coating 46. After that step, the photoresist layer 50 is removed and a continuous layer of aluminum is deposited over the glass coating 46. Then, a fourth layer of photoresist (not shown) and a fourth photomask (not shown) are used to define the conductors 34, 36 as shown in FIG. 6.

As a result of the processing described herein the N type substrate 12 is isolated from the N+ diffusions 18, 22, 38, and 39 by the various P wells 15, 42, 43 thereby preventing conventional contact from the upper surface 30 of the device 14 to the substrate 12. When convenient, contact can be made to the bottom of the substrate 12 (not shown) which becomes an N+ layer during the processing of the integrated circuit device 10. However, that is not convenient in the case of many plastic packages in general use. When these packages are used, electrical contact cannot be made to the bottom of the integrated circuit. Accordingly, a method of making electrical contact to the substrate 12 and integrated circuit devices 10 through the upper surface 30 has been required.

Normally the amount of current which flows from the substrate of a COS/MOS device is extremely small. Therefore a low resistance contact to the substrate 12 is not essential because the minimal current flow insures that the voltage drop in the substrate 12 will also be minimal. Even if there were a heavy substrate current surge, the fact that the PN junctions formed by the sources of the P-channel IGFETs and the N type substrate are forward biased insures that the substrate potential cannot differ by more than a diode drop from the potential source of the P-channel transistors. Therefore, a relatively high resistance substrate contact suffices to maintain appropriate substrate potential and to insure rapid recovery from any current surges.

Figure 7:
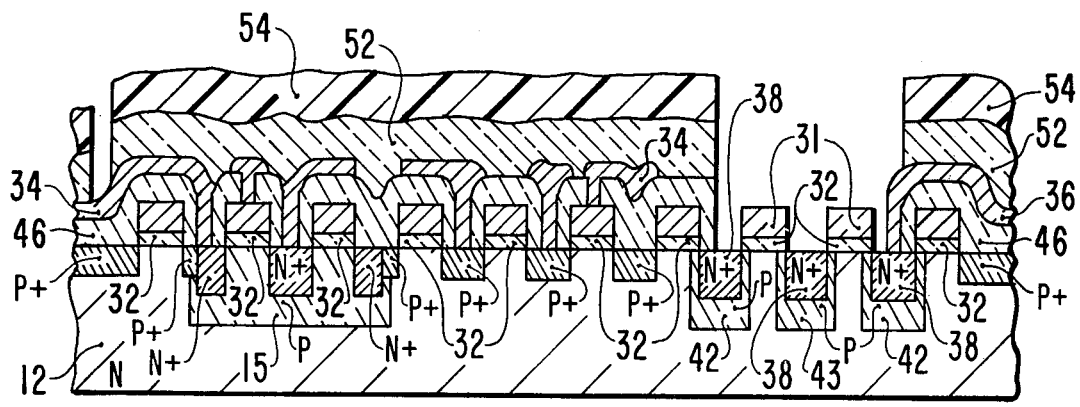

With reference to FIG. 7, the method of completing the formation of a suitable substrate contact is explained. First, an oxide layer 52 is formed over the previously described coatings on the substrate 12 by deposition, such as by the thermal decomposition of silane. Next, a photoresist layer 54 is formed over the oxide layer 52 and the photoresist layer 54 is defined by a fifth photomask (not shown) to provide bond pad openings for making contact to the conductors 34, 36. Using the photoresist layer 54 as a mask, the exposed portions of the oxide layers 52, 46, are removed by etching using an etchant for silicon dioxide, such as buffered HF. The etch will stop when it reaches the metallic conductors 34, 36 and the polycrystalline silicon gate-like structure 31. In order to remove the polycrystalline silicon gate-like structure 31 and its underlying oxide region 32, a plasma etch is employed. A plasma etch is an etch conducted in an atmosphere of freon ($CHF_3$) and nitrogen contained in an rf field. Following the removal of the polycrystalline silicon regions 31 and their underlying oxide regions 32, the substrate is placed in an ion implantation apparatus where a low dose ion implantation of an N type impurity, such as phosphorus, is made over the entire surface. For example, $5 \times 10^{13}$ atoms of phosphorus/cc may be implanted at 5KeV. Many of the implanted ions are electrically active without high temperature activation when the substrate is heated to about 450° C. for alloying the aluminum contacts. The ion implantation converts the regions of the P wells 42, 43 underlying the surface 30 to N type thereby forming region 40, as shown in FIG. 1. Following the formation of region 40 there is a continuous, conductive path between the conductor 36, N+ regions 38 and 39, and N type region 40 to the substrate 12, thereby forming an electrical contact to the substrate of the device 10.

The present invention may also be used to alter the threshold characteristics of selected, individual silicon gate IGFETs in either a $C^2L$ or a conventional process by implanting ions through gates which are exposed by the bond pad photomask in the manner heretofore described. In such cases, the invention could not be used to make top surface contacts because the plasma etch step would have to be eliminated.

What is claimed is:

1. An improved method for altering the threshold voltage characteristics of individual, isolated silicon gate IGFETs comprising the steps of:
    (a) forming a plurality of IGFETs having silicon gates on a single substrate;
    (b) forming metal contacts to said IGFETs, said metal contacts not overlying the gates of selected ones of said IGFETs;
    (c) forming a protective oxide layer over said IGFETs and over said metal contacts;
   wherein the improvement comprises:
    (a) photolithographically defining an etch resistant mask through which are exposed the portions of said protective oxide layer which overlie:
       (i) selected portions of said metal contacts, which selected portions of said metal contacts are used as bond pads; and
       (ii) selected ones of said silicon gates, which selected ones of said silicon gates are the individual, isolated silicon gate IGFETs whose threshold voltage characteristics are to be modified;

(b) removing said exposed portions of said protective oxide layer by etching, thereby exposing said selected portions of said metal contacts and the silicon gates of said selected ones of said IGFETs; then (c) ion implanting selected conductivity modifiers through said selected isolated silicon gates, through the underlying gate insulator and into the channel region of the selected IGFETs, thereby modifying the threshold voltage characteristics of said selected IGFETs.

2. The method of claim 1 wherein said step of photolithographically defining is accomplished using a single photomask.

* * * * *